Nov. 13, 1956 H. N. FRIHART ET AL 2,770,724
CONVERTER
Filed July 26, 1952 4 Sheets-Sheet 1

INVENTORS.
Henry Neil Frihart,
BY George F. Baroch,
Foorman L. Mueller
Atty.

Nov. 13, 1956 H. N. FRIHART ET AL 2,770,724

CONVERTER

Filed July 26, 1952 4 Sheets-Sheet 2

INVENTORS.
Henry Neil Frihart,
George F. Baroch,
BY Foorman L. Mueller
Atty.

CONVERTER

Filed July 26, 1952 4 Sheets-Sheet 3

INVENTORS.
Henry Neil Frihart,
BY George F. Baroch,
Foorman L. Mueller
Atty.

CONVERTER

Filed July 26, 1952 4 Sheets-Sheet 4

INVENTORS.
Henry Neil Frihart
BY George F. Baroch
Foorman L. Mueller
Atty.

United States Patent Office 2,770,724

Patented Nov. 13, 1956

2,770,724

CONVERTER

Henry Neil Frihart, Brookfield, and George F. Baroch, Lombard, Ill., assignors to Motorola, Inc., Chicago, Ill., a corporation of Illinois Application July 26, 1952, Serial No. 301,102

9 Claims. (Cl. 250—20)

The present invention relates to ultra high frequency tuning devices and more particularly to a converter for receiving signals in the ultra high frequency range and converting the same to signals in the very high frequency range for use with television receivers or the like.

Standard television receivers presently in use are capable of receiving television signals in the very high frequency range extending to 216 megacycles. New television transmitting stations are being established for operation in the ultra high frequency range between 470 and 890 megacycles. To provide operation of present receivers at such frequencies, a converter may be provided between the ultra high frequency receiving antenna and the antenna terminals of the receiver. Such converters have antenna input circuits tunable in the ultra high frequency range together with oscillator and mixer circuits for converting the received signals to a lower frequency output signal in the very high frequency range to which the television receiver may be tuned. Resonant circuits tunable through a band of frequencies of about 470–890 megacycles in the ultra high frequency range are very difficult to provide since at such frequencies of operation nearly all of the electrically conductive elements in the circuit exhibit relatively unpredictable inductive and capacitive reactances. Other problems are encountered in order to obtain continuously variable tuned resonant circuits with satisfactory Q and selectivity in the ultra high frequency range. Further, when ganging the tuning elements of continuously tuned resonant circuits including antenna and oscillator circuits with single dial continuous tuning for receiving television stations in the ultra high frequency range, tracking difficulties are encountered due to the comparatively wide tuning range and the inherent characteristics of the variable tuned elements in the resonant circuits required for such frequencies of operation.

It is an object of the present invention to provide a continuously variable tuning unit for operation in the frequency range of 470 to 890 megacycles with very high initial Q and selectivity.

Another object of the invention is to provide a continuously variable tuning unit operable in the ultra high frequency bands and having means to adjust its frequency response in relation to the movement of its tuning element at either end of the range of movement and also intermediate the range of movement to facilitate tracking when such tuning unit is ganged for single dial tuning with other continuously variable tuning units.

A further object of the invention is to provide an improved ultra high frequency television converter adapted to be continuously tuned for receiving television signals in the ultra high frequency range and to convert the received signals to an output signal in the very high frequency range, as for example, an output signal in the frequency range of 76 to 82 megacycles corresponding to channel 5 or in the range of 82–88 megacycles corresponding to channel 6.

A still further object of the invention is to provide an ultra high frequency television converter including ganged tuning units for respectively tuning antenna and oscillating circuits, with each of the units providing a change in frequency varying substantially linearly with operation of the tuning control to provide easy tuning and accurate tracking over a very wide range of frequencies.

A feature of the invention is the provision of a compact ultra high frequency television converter structure having a high-Q capacity loaded variable cavity tuner in the antenna circuit, and a series resonant tuning unit in the oscillator circuit formed of spaced conductive coatings and a conducting core movable therewith to interconnect the same and simultaneously vary the capacity and inductance of the tuned circuit.

Another feature of the invention is the provision of a continuously tunable resonant circuit including a capacity loaded coaxial cavity tuning unit with an auxiliary movable conductor positioned within the cavity for varying the resonant frequency thereof, an adjustable closure at one end to vary the length of the cavity, and a sleeve of conductive material adjustably positioned about the movable conductor. In such an arrangement, the adjustable closure provides an adjustment for the minimum frequency response of the unit and the adjustable sleeve provides an adjustment of the frequency response of the unit in the intermediate range of movement of the conductive member.

A further feature of the invention is the provision of a continuously tunable series resonant circuit operable in the ultra high frequency range including a tube of insulating material having spaced conductive coatings thereon including a first substantially uniform conductive coating to form one electrode of a condenser and a second helically shaped conductive coating to form an inductance and an axially movable conducting core within the tube and of such length as to span the spaced conductive coatings to thereby form a series resonant circuit having capacity and inductance both adjustable by the axial movement of the member. The length of the conducting core is adjustable to predetermine the maximum frequency response of the unit. The conducting core may carry one or more conducting turns, insulated with respect to each other to determine the resonant frequency of the unused part of the helical inductance portion as the core is moved out of this portion.

A still further feature of the invention is the provision of a continuously tunable ultra high frequency television converter including one or more resonant circuits of the above mentioned coaxial cavity type in the antenna circuit and including a tuner of the above-mentioned series resonant type in the oscillator circuit, with the axially movable tuning elements being ganged for simultaneous movement and the gang connections providing axial positioning of the tuning elements of the resonant circuits relative to each other to obtain the desired tracking at the extreme ranges of the tuner frequency response and the sleeve of the cavity tuner providing adjustment at an intermediate point in the range to thereby provide three point tracking.

Further objects, features and the attending advantages of the invention will be apparent from a consideration of the following specification and drawings in which.

In practicing the invention, a pair of continuously tunable resonant units are connected in antenna and oscillator circuits respectively to form a frequency converter adapted to receive signals in the frequency range of 470 to 890 megacycles. Each of the resonant units is provided with an axially movable tuning element which varies the frequency thereof substantially linearly with movement, and with the two elements being ganged together for single control tuning. The continuously variable tuned resonant unit of the antenna circuit is a tunable cavity including a tube of conductive material closed at one end and provided with an adjustable closure of conductive material at the other end for predetermining the interior length of the tube and therefore its minimum resonant frequency. A sleeve of conductive material is adjustably positioned within the tube to surround a portion of the path of movement of the axially movable tuning element to align the circuits in the intermediate portion of the tuning range. The resonant unit of the oscillator circuit includes a tube of insulating material having spaced conductive coatings thereon including a first substantially uniform coating and a second helical coating. The axially movable tuning element is of conducting material having portions movable adjacent the spaced conductive coatings to form a continuous tuned resonant circuit of variable capacity and inductance. The tuning element is adjustable in length and is provided at one end with spaced conductive rings for providing an inductive short circuit for the unused portions of the helical conductive coating.

Figures 1, 13:
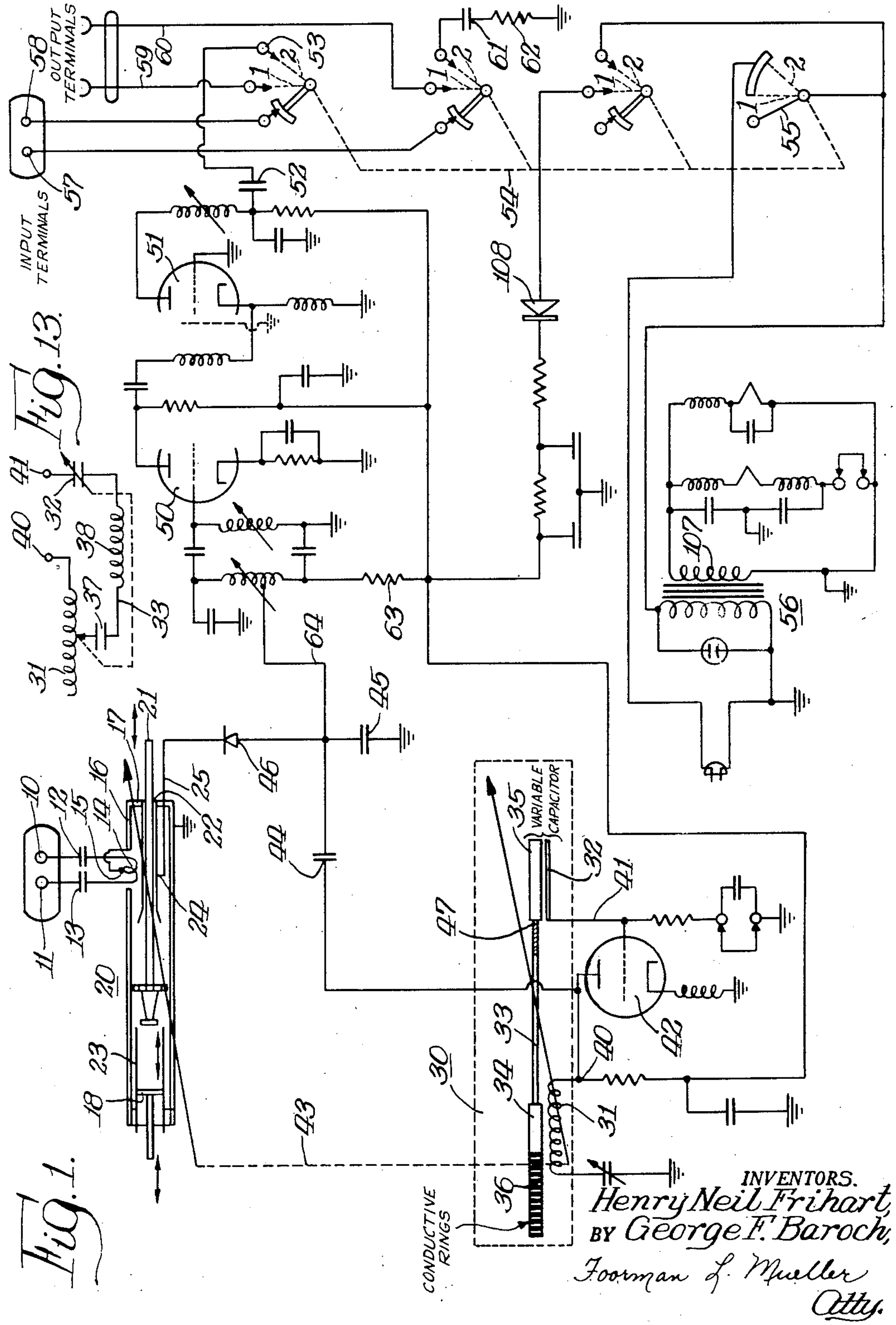
Fig. 1 is a circuit diagram of an ultra high frequency television converter in accordance with the invention.
Fig. 13 is a simplified electrical circuit equivalent to the oscillator tuning unit shown in Fig. 1.

Referring to Fig. 1 of the drawings, the antenna terminals 10 and 11 are connected through coupling condensers 12 and 13 to a coupling loop 14 which is center tapped at 15 to the conductive shell or tube 16 and chassis ground. The conductive tube 16 is preferably formed of brass or other highly electrically conductive metal and is closed at one end as shown at 17. The tube 16 is also provided with an adjustable closure 18 at the other end thereof. The closure 18 which may also be formed of brass is threaded within the tube 16 to predetermine the length of the interior volume of the tube and therefore the minimum resonant frequency of the variable capacity loaded tuning element thus provided as generally shown at 20. A conductive member 21 is axially slidable at 22 in the end 17 of the tube 16 to be coaxially positioned therein and the axial position of the conductive member 21 is effective to determine the resonant frequency and therefore enables the variable capacity loaded coaxial tuning element to be continuously tuned. In order to adjust the frequency response of the coaxial tuning unit 20 at the midrange of adjustment of the movable tuning element 21, a metallic sleeve 23 is axially threaded within the tube 16 and its axial position determines such mid-range frequency response. The output of the coaxial tuning unit is provided by a conductor at the point 24 which is connected to the wire 25 extending through the end 17 of the tube 16.

A second continuously tuned resonant unit is generally indicated at 30 and includes an inductive coil portion 31 and a variable capacitor portion 32. An axially movable slug of electrically conductive material is shown at 33 having enlarged end portions 34 and 35, respectively, adjacent the inductive coil portion 31 and variable capacity condenser portion 32. A plurality of insulatingly spaced conductive rings 36 are also movable with the tuning slug 33 and are positioned adjacent the conductive coil portion 31 of the circuit so that unused coil turns of the circuit are effectively short-circuited as the tuning slug 33 is moved to the right of the drawing.

With reference to Fig. 13 of the drawings, an equivalent electrical circuit for the continuous tuning unit 30 is shown. The coil portion 31 is as indicated and the one capacitor electrode 32 is also indicated in Fig. 13 in the drawings. The axially movable tuning slug 33 electrically interconnects the inductive portion 31 to the capacitor electrode 32, with the tuning slug forming a condenser with the inductive portion as indicated at 37 and having some inductance as indicated at 38 so that a resonant circuit is provided thereby. The movement of the tuning slug 31 in one direction is effective to decrease the inductance and capacity causing the circuit to be tuned to a higher frequency. The movement of the tuning slug 33 in the opposite direction of course has the opposite result in that the circuit is tuned to a lower frequency. The terminals 40 and 41 are connected to plate and grid electrodes respectively of a triode electron tube 42 connected in an oscillator circuit.

The axially movable tuning slug 33 and the axially movable conductive member 21 are ganged together as indicated by the dotted lines at 43 for simultaneous movement. The output of the oscillator tube 42 is provided by the condenser 44 connected to the plate electrode of the oscillator tube 42 and to the condenser 45 which in turn is connected in series with the mixer crystal 46 connected to line 25 and the output conductor 24 of the tuning unit 20. Thus, in such arrangement, a continuously tuned superheterodyne circuit including the antenna tuning unit 20 and the oscillator tuning unit 30 is obtained. The variable capacity loaded coaxial tuning unit 20 is effective to tune through a range of about 470 to 890 megacycles. In order to obtain tracking between the continuously tuned unit 20 and the continuously tuned unit 30, a number of adjustments are provided. As previously mentioned, the variable capacity loaded coaxial tuning unit 20 may be adjusted at the low end of its frequency range by means of the adjustable closure 18 and may be adjusted in the middle range of movement of its tuning element by means of the adjustable sleeve 23. The conductive portion 35 of the tuning slug 33 of the oscillator tuning unit 30 is threadedly connected at 47 to adjustably predetermine the distance between conductive slugs 34 and 35 and predetermine the maximum resonant frequency of the oscillator tuning unit 30. The adjustment of the minimum resonant frequency of the oscillator tuning unit 30 and the maximum resonant frequency of the variable capacity loaded coaxial tuning unit 20 may be determined relative to each other by the gang connections of the axially movable tuning elements with each other.

The continuously tuned oscillator tuning unit 30 provides an output signal which is mixed in the mixer cirkuit including the crystal 46 and condenser 45 with the output signal of the coaxial variable capacity loaded tuning unit 20 to provide an intermediate frequency signal across the condenser 45 within the very high frequency range corresponding to either channel 5 or channel 6 as now being used for transmission by the very high frequency television stations now in operation.

A wide band tuned intermediate frequency amplifier circuit including triode amplifier tubes 50 and 51 is connected to amplify the intermediate frequency output signal appearing across condenser 45 and the output from amplifier tube 51 is connected through the coupling condenser 52 to the contact 53 of gangswitch 54. The gangswitch 54 is provided with a switch arm 55 adapted to control energization of power supply 56 for supplying filament and plate voltages to the oscillator tube 42 and the amplifier tubes 50 and 51. It should be understood that the amplifier tubes 50 and 51 may actually comprise two sections of a dual triode tube. In the first dotted line position 1 of the switch 54 the conventional antenna terminals 57 and 58 are connected to the output terminals 59 and 60. In the second dotted line position 2 of the switch 54 the output signal appearing across condenser 52, which is the amplified output signal from the superheterodyne converter, is connected to output terminal 59, and the output terminal 60 is returned to ground through the condenser 61 and resistor 62 which is desirable for matching the input terminal impedance of a television set to which the output terminals 59 and 60 may be connected.

It is believed that the operation of the television converter as previously described in connection with Figs. 1 to 13 of the drawings should now be understood. It should be pointed out, however, that the mixer used in the tuner is a germanium crystal shown at 46 which may be specially designed for ultra high frequency application. The impedance that the crystal 46 offers to the antenna circuit is variable depending on the oscillator injection and this impedance is therefore stabilized by applying a fixed bias to the crystal. Such bias consists of the positive voltage applied through the resistor 63 and line 64. As the oscillator tuning unit 30 is tuned the insulatingly spaced conductive rings 36 act as inductive shorted turns for the unused inductive turns of the coil 31 in a manner to reduce the effective value of the unused inductance portions and keep the resonant frequency of such unused inductance circuit above the response frequency of the variably tuned unit. If desired, a solid metallic rod may be used in place of the spaced conductive rings 36 although it has been found that a solid rod tends to increase the distributed capacitance of the unused coil portions as fast as it decreases the inductance with the result that the resonant frequency of the unused circuit is very little affected by the solid form of detuning slug.

It has been found that the variable capacity loaded coaxial tuning unit 20 has an unloaded Q ranging from 1,000 to 1,500 and is therefore quite satisfactory for use as in variably tuned antenna or mixing circuit. The continuously variably tuning unit 30 of the oscillator circuit has a lower Q than the tuning unit 20 but is very satisfactory for use in an oscillator circuit since no sliding contacts are employed. The design of both the variable capacity loaded tuning unit 20 and the oscillator tuning unit 30 is such as to provide a linear frequency scale with movement of the tuning elements to thereby prevent crowding of the stations on the tuning dial.

Figures 8, 9, 10, 11, 12:
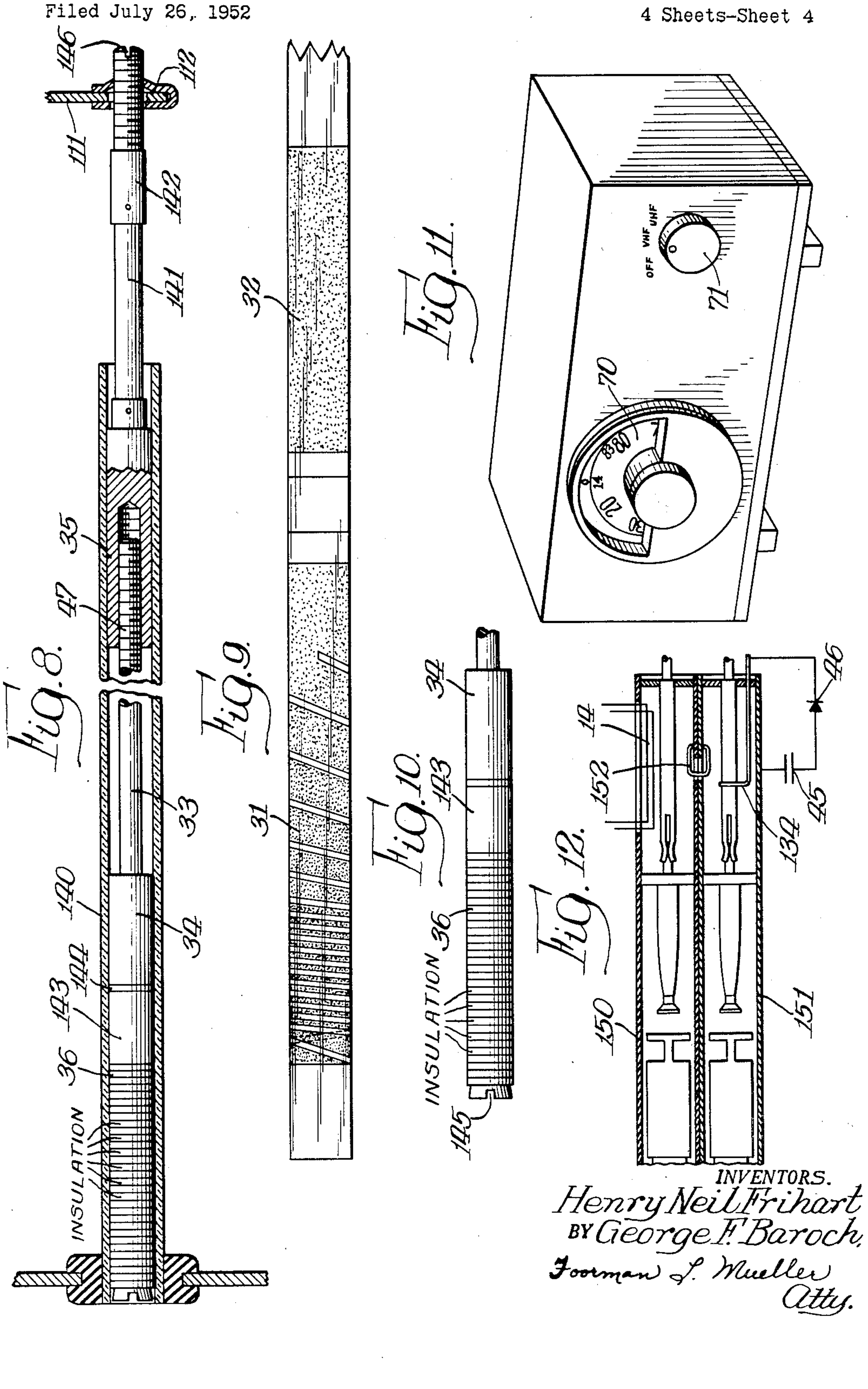
Fig. 8 is a section on the line 8—8 of Fig. 3.
Fig. 9 is a fragmentary elevation to show details of the oscillator inductive and capacitive conductive coatings.
Fig. 10 is a fragmentary elevation of the movable conductive element of the oscillator tuning unit to show the inductor shorting rings.
Fig. 11 is a perspective of the television converter installed in a cabinet.
Fig. 12 is a section through a modified form of variable capacity loaded coaxial tuning unit.

In Fig. 11 of the drawings the television converter of the invention is shown as it appears within its cabinet housing and the dial 70 is indicated for movement with the tuning element gang connection. A number of the ultra high frequency television channels are shown on the tuning dial and it will be seen that the channels are relatively uncrowded on the dial. The gang switch 54 is controlled by the knob 71 through which the condition of operation of the television converter and the television receiver may be predetermined.

Figure 2:
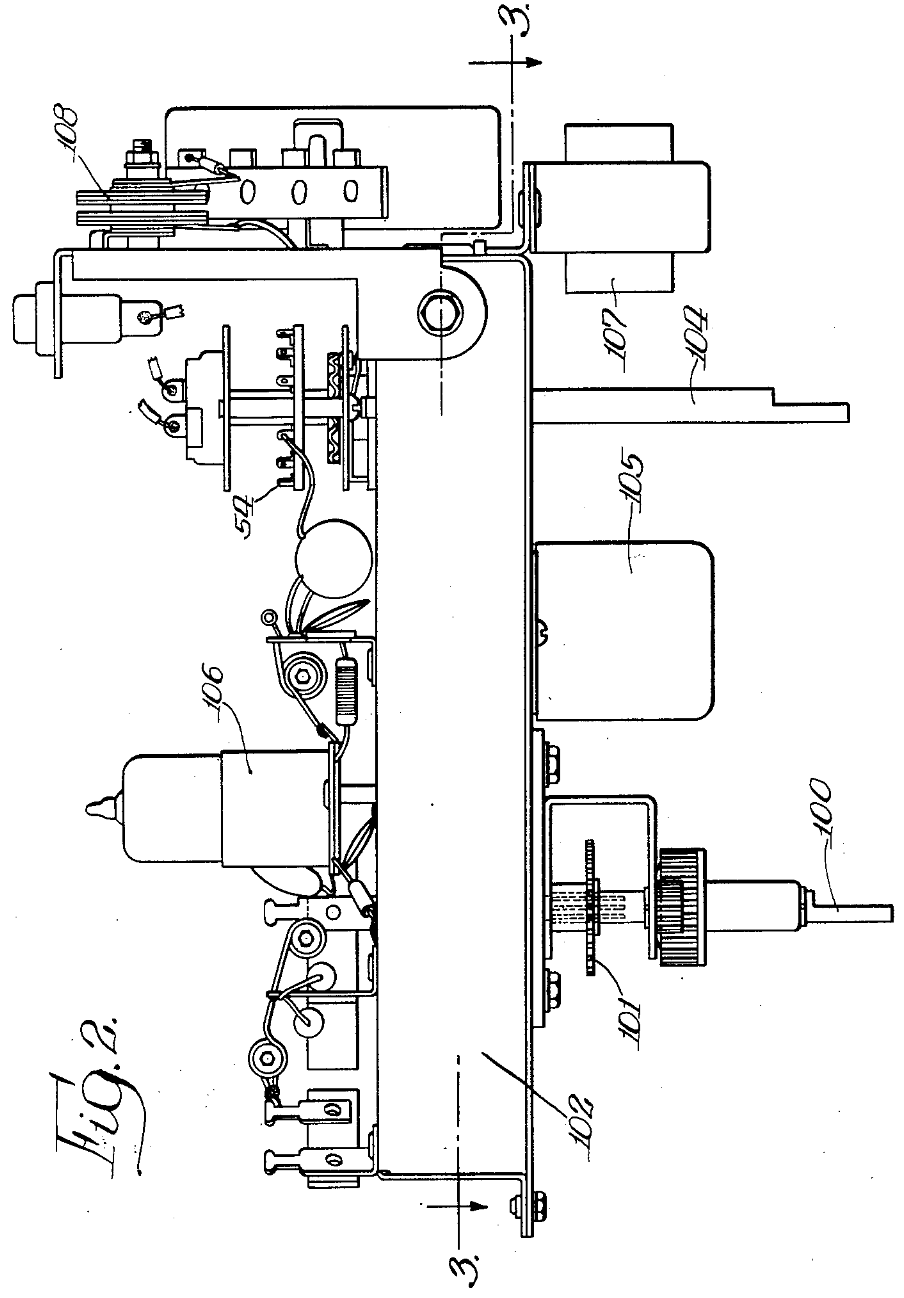
Fig. 2 is a side elevation of the converter chassis assembly.

Referring now to Fig. 2 of the drawings, mechanical details of the chassis on which the converter circuit of Fig. 1 is mounted, will be described. The tuning shaft 100 is connected by means of the reduction gearing 101 to a pinion that is pivotally supported within the chassis 102. The pinion is indicated at 103, Figs. 3 and 4 of the drawings, and will be later described in more detail. The gang switch 54 is provided with the shaft 104 and the oscillator tube 42 is contained within the shield housing 105. The amplifier tubes 50 and 51 which, as previously mentioned, may be comprised of a double triode tube, and this tube is received in the tube socket 106. Various other elements of the converter circuit such as the power transformer 107 and the selenium power rectifier 108 are supported on the chassis structure 102, and need not be further described.

Figures 3, 4, 5, 6, 7:
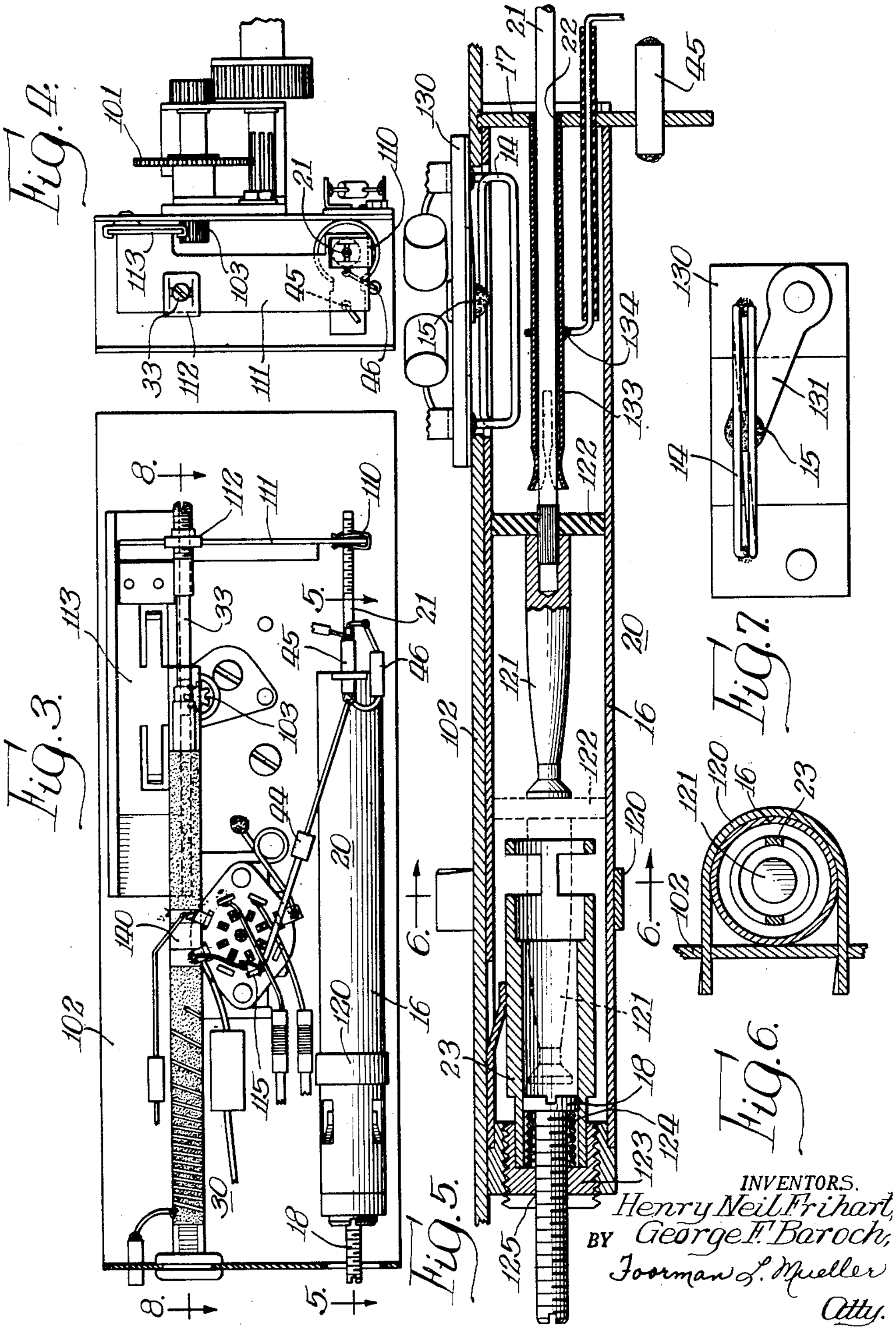
Fig. 3 is a section on the line 3—3 of Fig. 2.
Fig. 4 is an end view of the converter chassis as seen from the right of Fig. 2.
Fig. 5 is a section on the line 5—5 of Fig. 3 showing the variable capacity loaded coaxial tuning unit.
Fig. 6 is a section on the line 6—6 of Fig. 5.
Fig. 7 is a plan view of the antenna coupling loop.

Referring now to Figs. 2, 3 and 4 of the drawings, the tuning units 20 and 30 are shown to be enclosed and supported within the chassis 102. The axially movable tuning element 21 of the tuning unit 20 is threadably connected at 110 to a cross arm 111. The axially movable tuning slug 33 of the oscillator tuning unit 30 is threadably connected at 112 to the cross arm 111. The cross arm 111 is supported on a cross slide structure 113. The cross slide member 113 is provided with rack gear teeth engaging the pinion gear 103 so that rotation of the tuning shaft 100 causes an axial movement of the cross slide 113 and cross arm 111 to impart a corresponding axial movement to the tuning elements 21 and 33. Also in connection with Fig. 3 of the drawings, the mixer crystal 46 is shown to be connected to the condenser 45 and the condenser 44 to the plate electrode contact 115 for the oscillator tube socket.

Referring now to Figs. 5–7 of the drawings, the details of the variable capacity loaded coaxial tuning unit 20 will be described. This unit is in effect a tunable resonant cavity. The tubular conducting member 16 is secured to the chassis 102 by means of the metal strap 120. The tube 16 is closed at one end by the metal plug 17 which is secured thereto by brazing, welding or the like. The axially movable tuning element 21 is shaped as shown at 121 and is formed of conductive material such as brass or the like. An insulating spacer 122 serves to maintain the coaxial position of the axially movable member 21 and its conductive portion 121, as it is moved within the tube 16. The other end of the metal tube 16 is closed by the metallic threaded bushing 123 into which is threaded the threaded adjustable closure 18 formed of suitable conductive metallic material such as brass. A compression spring 124 is provided to maintain the adjusted position of the closure 18 as determined by the rotation of the threaded shank is received in the threaded opening 125 of the threaded bushing 123. The threaded bushing 123 is in turn threadably received within the tube 16. The metallic sleeve 23 is secured to the threaded bushing 123 and the relative adjustments of the threaded closure 18 in the threaded sleeve 23 determine the minimum frequency response and the middle frequency response of the tuning unit 20 for the extreme lefthand position and the mid position, respectively, of the axially movable tuning element 21.

The antenna coupling coil or loop 14 is supported on an insulating sheet 130 which may be removably secured to the chassis 102 with the coil 14 extending through a suitable opening of the chassis 102 and the tubular member 16 into the interior of the tubular member 16. The center tap 15 of the coil 14 is soldered to the metallic connecting lug 131 which when the insulating member 130 is secured to the chassis 102 is electrically grounded to the chassis. The axially movable tuning element 21 is slidably supported within the metallic sleeve 133, and an output loop of wire is wrapped around the sleeve 133 and electrically connected thereto, as indicated at 134.

Referring now to Figs. 8–10 of the drawings, the details of the continuously tuned unit 30 of the oscillator circuit will be described. A tube of insulating material which may be glass or the like is shown at 140 and is provided with two spaced conductive coatings on the outer surface thereof. The first conductive coating portion 32 is substantially uniform and forms an electrode of the variable capacitor as previously described in connection with Figs. 1 and 13 of the drawings. The second conductive coating portion is helically formed as indicated at 31 to form an inductance or coil. Slidably received within the insulating tube 140 is the axially movable tuning slug 33 having the enlarged conductive portion 34 adjacent the inductive coating 31, and the enlarged conductive portion 35 adjacent the conductive coating portion 32. The connecting portion of the tuning slug 33 is also formed of electrically conducting material and is threaded at 47 to adjustably predetermine the distance between the conductive portions 34 and 35. The conductive portion 35 is connected by an insulating shaft 141 to the threaded end 142 which is secured at 112 to the cross arm 111. A conductive ring 143 is insulatingly spaced at 144 and secured to the conductive portion 34 for movement with the tuning slug 33. A plurality of additional insulatingly spaced conductive rings 36 are secured for movement with the conductive portion 143. These conductive rings effectively short circuit the unused coil portions of the conductive coating 31 as the tuning slug 33 is moved in the direction to the right of the drawing. This reduces the inductance of the unused coil portions and tunes the same above the frequency range being used so that they do not affect the operation of the oscillator. A screw driver slot 145 is provided for turning the threaded connection 47 and adjusting the spacing between the conductive portions 34 and 35, and a similar screw driver slot 146 is provided for adjusting the threadable connection 112 when ganging the operation of the tuning element 33 with the tuning element 21 of the variable capacity loaded coaxial tuning unit 20.

With reference to Fig. 12 of the drawings, a modified form of the invention is shown with which additional selectivity may be obtained. A pair of variable capacity loaded continuously tuned tuning units 150 and 151 are assembled together as shown. Each of the variable capacity loaded coaxial tuning units 150, 151, is substantially identical with the variable capacity loaded coaxial tuning unit 20 previously described in detail, except that the antenna input coil 14 is associated with the coaxial tuning unit 150, while the output coupling loop 134 is connected to the coaxial tuning unit 151. A coupling loop 152 is provided for coupling the signals from the tuning unit 150 to the tuning unit 151. The connection of the two variable capacity loaded coaxial tuning units 150 and 151 as shown provides additional selectivity and an improved image rejection ratio since the circuit is in effect double tuned, as should be readily understood.

In the foregoing, both electrical and mechanical details of a novel form of superheterodyne tuner adapted to receive signals in the ultra high frequency range and convert said signals to an output signal in the very high frequency range have been described. The two forms of tuning units for use in the antenna and oscillator circuits respectively, assure that the superheterodyne tuner will provide satisfactory reception over the entire ultra high frequency range of 470 to 890 megacycles. The threaded adjustments 110 and 112 together with the threaded adjustments 47 and the adjustment of the positions of the closure 18 and sleeve 23 assure that the tracking of the superheterodyne converter circuit will be maintained over the entire tuning range. The adjustment of the position of the metallic sleeve 23 is of particular advantage in that the frequency response of the variable capacity loaded coaxial tuning element 20 may be adjusted in its mid-range of tuning to compensate for the frequency response of the oscillator tuning unit 30 in its mid-range of response. Thus in such manner the required tracking is obtained over the entire tuning range of the converter.

The ultra high frequency converter in accordance with the invention is adapted to be used as a small external unit or to be built into a television receiver. When used as an external unit it can be provided in a housing as illustrated in Fig. 11 and positioned on top of, or otherwise adjacent the receiver. It is merely necessary to connect the converter to the standard 110 volt power source and to an antenna and to the antenna connection of the receiver. When used as an internal unit, the power supply 56 may be omitted and the tubes of the converter may be energized directly from the television receiver power supply. The switch 54 may also be combined with other controls of the receiver and may thereby be eliminated as a separate control.

Various modifications may be made within the spirit of the invention and the scope of the appended claims.

We claim:

1. An ultra high frequency tuner for receiving signals over a wide range in the ultra high frequency band and producing a lower fixed frequency output signal, said tuner including in combination, a variable frequency resonant oscillator section, a variable frequency resonant antenna section, said oscillator section including a variable frequency resonant circuit having axially movable tuning means, said antenna section including a variable coaxial capacity loaded tuned cavity unit having an axially movable coaxial element for varying the resonant frequency thereof, said axially movable coaxial element being electrically connected to one end of said unit and capacitively coupled to the other end thereof, means for ganging said axially movable tuning means and said coaxial element for simultaneous movement to vary the resonant frequencies of said antenna and oscillator sections such that the output signal of the tuner remains substantially the same over a predetermined tuning range, and an axially movable conductive sleeve mounted in said tuned cavity unit, said sleeve being electrically connected to said cavity unit at said other end thereof and in variable capacitive relation with said movable coaxial element therein to adjustably predetermine the capacity loading and the resonant frequency of said cavity unit in the middle range of travel of said coaxial element to maintain the tracking of said oscillator and antenna sections over their entire tuned resonant ranges.

2. An ultra high frequency tuner for tuning over a wide range of ultra radio frequency input signals to produce a lower fixed frequency output signal including in combination, a variable frequency resonant oscillator section, a variable frequency resonant antenna section, said oscillator section including spaced coil and condenser portions together with electrically conductive means spanning said coil and condenser portions and movable axially thereof to provide a variable frequency series resonant oscillator circuit, said antenna section including a variable coaxial capacity loaded resonant tuned unit having a conductive tubular portion and an axially movable coaxial element therein for varying the resonant frequency thereof, said axially movable coaxial element being electrically connected to one end of said tubular portion and capacitively coupled to the other end of said tubular portion, means for ganging said conductive means and said coaxial element for axial movement to simultaneously vary the resonant frequencies of said oscillator and said antenna sections such that the output signal of the tuner remains substantially the same over the entire tuning range, and an axially movable conductive sleeve mounted in said coaxial tuned unit, said sleeve being electrically connected to said other end of said tubular portion and in variable capacitive relation with said movable coaxial element therein to adjustably predetermine the capacity loading and the resonant frequency of said coaxial tuned unit in the middle range of travel of said coaxial element to maintain the tracking of said oscillator and antenna sections over their entire tuned resonant ranges.

3. An ultra high frequency converter for tuning over a wide range of ultra high radio frequency input signals to produce a fixed frequency intermediate output signal comprising in combination, a variable frequency resonant oscillator section, a variable frequency resonant antenna section, said oscillator section including spaced coil and condenser portions together with electrically conductive means spanning said coil and condenser portions and movable axially thereof to provide a variable frequency series resonant inductive and capacitive oscillator circuit, means to adjust the length of said conductive means for a predetermining the axial position of said conductive means for the maximum resonant frequency of said oscillator circuit, said antenna section including a coaxial variable capacity loaded resonant tuned unit having a conductive tubular portion and an axially movable coaxial element therein for varying the resonant frequency thereof, said movable coaxial element being electrically connected to one end of said tubular portion and capacitively coupled to the other end thereof, means for ganging said conductive means and said coaxial element for axial movement to simultaneously vary the resonant frequencies of said oscillator circuit and said antenna resonant unit such that the output signal of the tuner remains substantially the same over the entire tuning range, adjustable means connecting said conductive means to said ganging means for predetermining the axial position of said conductive means for the minimum resonant frequency of said oscillator circuit, and an axially movable conductive sleeve mounted in said coaxial variable capacity loaded tuned unit, said sleeve being electrically connected to said other end of said tubular portion and in variable capacitive relation with said movable coaxial element therein to adjustably predetermine the capacity loading and the resonant frequency thereof in the middle range of travel of said coaxial element to maintain the tracking of said oscillator and antenna sections over their entire tuned resonant ranges.

4. An ultra high frequency converter for tuning over a wide range of ultra high radio frequency input signals to produce a fixed frequency intermediate output signal comprising in combination, a variable frequency resonant oscillator section, a variable frequency resonant input section, said oscillator section including spaced coil and condenser portions together with electrically conductive means spanning said coil and condenser portions and movable axially thereof to provide a variable frequency series resonant inductive and capacitive oscillator circuit, said input section including a coaxial variable capacity loaded resonant tuned unit having a conductive tubular portion with an axially movable coaxial element therein for varying the resonant frequency thereof, said axially movable coaxial element being electrically connected to one end of said conductive tubular portion and capacitively coupled to the other end thereof, means for ganging said conductive means and said coaxial element for axial movement to simultaneously vary the resonant frequencies of said oscillator circuit and said input resonant unit such that the intermediate frequency output of the tuner remains substantially the same over the entire tuning range, axially adjustable capacity means mounted at said other end of said tubular portion in electrical contact with said tubular portion and providing the capacitive coupling to said movable coaxial element of said capacity loaded resonant unit for predetermining the axial position of said coaxial element for the minimum resonant frequency of said capacity loaded tuned unit, adjustable means connecting said coaxial element to said ganging means for predetermining the axial position of said ganging means for the maximum resonant frequency of said capacity loaded tuned unit, and an axially movable conductive sleeve mounted in said tubular portion of said coaxial variable capacity loaded tuned unit with said sleeve being connected to said other end of said tubular portion and in variable capacitive relation with said movable coaxial element to adjustably predetermine the capacity loading and the resonant frequency thereof in the middle range of travel of said coaxial element to maintain the tracking of said oscillator and input sections over their entire tuned resonant ranges.

5. An ultra high frequency converter for tuning over a wide range of ultra high radio frequency input signals to produce a fixed frequency intermediate output signals comprising in combination, a variable frequency resonant oscillator section, a variable frequency resonant input section, said oscillator section including spaced coil and condenser portions together with first electrically conductive means spanning said coil and condenser portions and movable axially thereof to provide a variable frequency series resonant inductive and capacitive oscillator circuit, second electrically conductive means movable with said first electrically conductive means and insulatingly spaced from the end thereof associated with said coil portion and movable into said coil portion as said first conductive means is withdrawn therefrom to inductively short circuit unused turns of said coil portion, said input section including a coaxial variable capacity loaded resonant tuned unit having an axially movable coaxial element for varying the resonant frequency thereof, means for ganging said conductive means and said coaxial element for axial movement to simultaneously vary the resonant frequencies of said oscillator circuit and said input resonant unit such that the intermediate frequency output of the tuner remains substantially the same over the entire tuning range, and an axially movable conductive sleeve mounted in said coaxial variable capacity loaded tuned unit, said sleeve being electrically connected to said unit and in capacitive relation with said movable coaxial element therein to adjustably predetermine the capacity loading and the resonant frequency thereof in the middle range of travel of said coaxial element to maintain the tracking of said oscillator and input sections over their entire tuned resonant ranges.

6. An ultra high frequency converter for tuning over a wide range of ultra high radio frequency input signals to produce a fixed frequency intermediate output signal including in combination, a variable frequency resonant oscillator section, a variable frequency resonant input section, sad oscillator section including spaced coil and condenser portions together with first electrically conductive means spanning said coil and condenser portions and movable axially thereof to provide a variable frequency series resonant inductive and capacitive oscillator circuit, second electrically conductive means movable with said first electrically conductive means and insulating spaced from the end thereof that is associated with said coil portion to inductively short circuit unused turns of said coil portion as said first conductive means is axially moved, means to adjust the length of sad first conductive means for predetermining the axial position of said first conductive means for the maximum resonant frequency of said oscillator circuit, said input section including a coaxial variable capacity loaded resonant tuned unit having a conductive tubular portion and an axially movable coaxial element therein for varying the resonant frequency thereof, means for ganging said conductive means and said coaxial element for axial movement to simultaneously vary the resonant frequencies of said oscillator circuit and said input resonant unit such that the intermediate frequency output of the tuner remains substantially the same over the entire tuning range, adjustable means connecting said first conductive means to said ganging means for predetermining the axial position of said ganging means for the minimum resonant frequency of said oscillator circuit, adjustable capacity means mounted at one end of said tubular portion, said capacity means being connected to said tubular portion and capacitively coupled to said movable coaxial element of said capacity loaded resonant unit for predetermining the axial position of said coaxial element for the minimum resonant frequency of said capacity loaded unit, adjustable means connecting said coaxial element to said ganging means for predetermining the axial position of said ganging means for the maximum resonant frequency of said capacity loaded tuned unit, and an axially movable conductive sleeve mounted in said tubular portion of said coaxial variable capacity loaded tuned unit, said sleeve being connected to said tubular portion and in capacitive relation with said movable coaxial element therein to adjustably predetermine the capacity loading and the resonant frequency of said unit in the middle range of travel of said coaxial element to maintain the tracking of said oscillator and input sections over their entire tuned resonant ranges.

7. In an ultra high frequency tuner for tuning over a wide range of ultra high radio frequency input signals, a variable tuned resonant device including in combination, a coaxial variable capacity resonant unit having an outer cylindrical shell of conductive material closed at one end, a plug of conductive material threaded into the other end of said shell and electrically connected to said shell at said other end to adjustably predetermine the length of said shell and predetermine the minimum resonant frequency thereof, an elongated member of conductive material coaxially positioned within said shell in capacitive relation with said plug and axially movable to vary the resonant frequency of said unit, said elongated member extending through said one end of said shell and electrically connected thereto and a sleeve of conductive material adjustably positioned within said shell and electrically connected to said shell at said other end thereof to surround a portion of the path of movement of said member, the adjusted position of said sleeve being effective to predetermine the resonant frequency of said unit when said member is in the middle range of its axial movement.

8. In an ultra high frequency tuner for tuning over a wide range of ultra high frequency input signals, a tunable resonant cavity unit including in combination, a tubular conducting member, a conductive plug enclosing one end of said tubular member in electrical connection therewith, an axially movable elongated conductive tuning element extending through said plug into said tubular member in coaxial relation therewith and in electrical connection with said plug, a conductive capacitive loading closure member threaded into the other end of said tubular member in variable capacitive relation with said tuning element to adjustably predetermine the effective length of said tubular member and the minimum resonant frequency thereof, and a conductive sleeve adjustably positioned within said tubular member for axial movement therein and electrically connected thereto at said other end to surround a portion of the path of movement of said tuning element and receive said tuning element in capacitive relation therewith, said sleeve being effective to predetermne the resonant frequency of said unit when said tuning element is in the middle range of its axial movement.

9. In an ultra high frequency tuner for tuning over a wide range of ultra high frequency input signals, a tunable resonant cavity unit including in combination, a tubular conducting member, a conductive plug enclosing one end of said tubular member in electrical connection therewith, an axially movable elongated conductive tuning element extending through said plug into said tubular member and in electrical connection with said plug, at least one insulating disc-like spacer element mounted within said tubular member for slidably supporting said tuning element coaxially within said tubular member, a conductive capacitive loading closure member threaded into the other end of said tubular member in capacitive relation with said tuning element to adjustably predetermine the effective length of said tubular member and the minimum resonant frequency thereof, a conductive sleeve adjustably positioned within said tubular member for axial movement therein and electrically connected thereto at said other end to surround a portion of the path of movement of said tuning element in variable capacitive relation therewith and receive said tuning element, said sleeve being effective to predetermine the resonant frequency of said unit when said tuning element is in the middle range of its axial movement, an input conductive loop extending into the interior of said tubular member and having a point thereon electrically connected to said tubular member, and an output connection extending through said tubular member and electrically connected to said tuning element.

References Cited in the file of this patent

UNITED STATES PATENTS

| | | |
|---|---|---|
| 2,180,413 | Harvey | Nov. 21, 1939 |
| 2,276,699 | Preisig | Mar. 17, 1942 |
| 2,338,134 | Sands | Jan. 4, 1944 |
| 2,394,391 | Martowicz | Feb. 5, 1946 |
| 2,417,182 | Sands | Mar. 11, 1947 |
| 2,471,419 | Edson | May 31, 1949 |
| 2,528,167 | Pan | Oct. 31, 1950 |
| 2,531,231 | Million | Nov. 21, 1950 |
| 2,566,759 | Clark et al. | Sept. 4, 1951 |
| 2,587,055 | Marshall | Feb. 26, 1952 |
| 2,622,203 | Kiebert | Dec. 16, 1952 |